United States Patent [19]

Jain et al.

[11] Patent Number: 5,240,807
[45] Date of Patent: Aug. 31, 1993

[54] PHOTORESIST ARTICLE HAVING A PORTABLE, CONFORMABLE, BUILT-ON MASK

[75] Inventors: Sangya Jain, Bridgewater, N.J.; Salvatore Emmi, Beaverton, Oreg.; Thomas S. Phillips, W. Warwick, R.I.

[73] Assignee: Hoechst Celanese Corporation, Somerville, N.J.

[21] Appl. No.: 388,769

[22] Filed: Aug. 2, 1989

Related U.S. Application Data

[63] Continuation of Ser. No. 87,379, Aug. 20, 1987, abandoned.

[51] Int. Cl.$^5$ .............. G03C 5/18; G03F 1/12; G03F 7/00
[52] U.S. Cl. .................. 430/148; 430/141; 430/176; 430/311; 430/312; 430/326; 430/327; 430/328
[58] Field of Search ............ 430/312, 311, 326, 328, 430/327, 148, 176, 141

[56] References Cited

U.S. PATENT DOCUMENTS

| | | | |
|---|---|---|---|
| 2,485,122 | 10/1949 | von Glahn et al. | 430/148 |
| 2,498,722 | 3/1950 | Straley | 430/163 |
| 2,523,889 | 9/1950 | von Glahn | 430/148 |
| 4,149,888 | 4/1979 | Loprest | 430/148 |
| 4,467,027 | 8/1984 | Yamamoto et al. | 430/176 |
| 4,576,893 | 3/1986 | Nakakita et al. | 430/176 |
| 4,699,924 | 10/1987 | Phillips et al. | 8/524 |
| 4,704,347 | 11/1987 | Vollenbroek et al. | 430/312 |
| 4,770,739 | 9/1988 | Orvek et al. | 430/312 |
| 4,863,827 | 9/1989 | Jain et al. | 430/148 |
| 4,937,176 | 6/1990 | Vollenbroek et al. | 430/148 |

FOREIGN PATENT DOCUMENTS

| | | | |
|---|---|---|---|
| 161660 | 11/1985 | European Pat. Off. | 430/312 |
| 164248 | 12/1985 | European Pat. Off. | 430/325 |
| 52-9351 | 3/1977 | Japan | 430/156 |
| 61-219037 | 9/1986 | Japan | 430/156 |

OTHER PUBLICATIONS

*Research Disclosure*, Jan. 1972, pp. 72-74.
MacIntyre M. W. et al., *IBM Technical Disclosure Bulletin*, vol. 14, No. 10, Mar. 1972, p. 2878.
Grant, J., "Hachk's Chemical Dictionary", 4th Ed., 1969, p. 182.
Anon, "1984-1985 Aldrich Catalog/Handbook of Fine Chemicals", 1984, Aldrich Chem. Co., Milwaukee, Wisconsin, p. 706.

*Primary Examiner*—Charles J. Bowers, Jr.
*Attorney, Agent, or Firm*—Richard S. Roberts

[57] ABSTRACT

A water soluble built-on mask layer is provided on a photoresist composition disposed on a substrate. The photoresist comprises an o-quinone diazide and a novolak or paravinyl phenol resin. The built-on mask layer comprises a water soluble, photobleachable diazonium salt, a coupler for the diazonium salt and an acidic, polymeric, film forming resin such as polystyrene sulfonic acid.

11 Claims, No Drawings

PHOTORESIST ARTICLE HAVING A PORTABLE, CONFORMABLE, BUILT-ON MASK

This application is a continuation of application Ser. No. 07/087,379, filed Aug. 20, 1987, abandoned.

BACKGROUND OF THE INVENTION

The present invention relates to a photoresist article having enhanced image contrast.

It is well known in the art to produce conventional photoresist formulations such as those described in U.S. Pat. Nos. 3,666,473, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in aqueous alkaline solutions, but the naphthoquinone sensitizer is not. Upon exposure of selected areas of the coated substrate to actinic radiation, however, the sensitizer undergoes a chemical change and the exposed areas of the coating are rendered more soluble than the unexposed areas. This difference in solubility rates causes the exposed areas of photoresist coating to be dissolved when the substrate is immersed in alkaline developing solution, while the unexposed areas are largely unaffected, thus producing a so-called positive relief pattern on the substrate.

In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of very large scale integrated circuits on silicon chips and similar components. Circuit density on such a chip can only be increased, assuming the same photolithographic techniques are utilized, by increasing the resolution capabilities of the resist.

Development contrast refers to the slope of a linear plot of film thickness remaining after various exposure doses versus the log of the exposure dose.

Resist resolution typically refers to the smallest equally spaced line pairs and intervening spaces of a mask which is utilized during exposure which can be reproduced with a high degree of image edge acuity in the exposed and developed photoresist.

In order to produce integrated circuits on a VLSI basis finer geometries and improved materials are required. The method of the present invention relates to the use of a photosensitive, portable, conformable built-on mask on top of a conventional photoresist. It is well known that diffraction of the light used to expose the resist as it passes through the mask and into the resist plays a very important role in decreasing the resolution and contrast that can be achieved with a given resist. This becomes more and more crucial as the circuit element size to be printed decreases. European Patent publication No. 0110165 reveals that contrast can be greatly improved by spinning a layer of a photosensitive liquid on top of a baked resist. The photosensitive layer contains a photobleachable dye which photodecomposes at the same wavelengths or wavelength of light used to expose the underlying resist. Effectively, the upper layer improves the resolution of the aerial image, thereby improving the contrast of the bottom resist. The upper photosensitive layer therefore contains a photobleachable dye that absorbs light used to expose the resist such that after bleaching of the material, the exposed areas of the material should be as transparent as possible, so that the light can efficiently decompose the sensitizer of the underlying photoresist. The rate of bleaching of the dye in the material should be equivalent to or slower than that of the sensitizer in the photoresist. Also, the optical density of the film should be as high as possible.

European Patent Publication 0110165 teaches the use of an arylnitrone as the photobleachable dye with a polymeric binder that is soluble only in environmentally pollutive organic solvents. A solution to the environmental problem was thereafter proposed by L. F. Halle, *A Water Soluble Contrast Enhancement Layer*, Journal of Vacuum Science Technology, Vol. B3(1), Jan./Feb. 1985. The proposal was to employ a contrast enhancement layer of diphenylamine-p-diazonium sulfate, polyvinyl alcohol, water, and maleic acid. Similarly, European Patent Publication 0161660 uses diazonium salts, binding resin, water and an acid component which enhances the solubility of the diazonium salt in the contrast enhancing layer and prevents the coupling of the diazonium salts with the phenolic component in the film.

However, these prior water based diazonium salt systems need the addition of an acidic compound to both enhance the solubility of the otherwise poorly soluble diazonium salts and also to prevent any coupling of the diazonium salt. In order to enhance the solubility of the diazonium salt in the EP 0161660 solution, an almost equimolar amount of, for example, p-toluene sulfonic acid, needs to be present. The instant invention provides enhanced contrast by providing a mask which is built onto the photoresist layer. In practice, a standard positive working photoresist composition is first coated onto a wafer and dried. On top of the resist is coated a composition which contains a sulfonic acid polymer, a diazonium salt and a coupler in a water solution. The sulfonic acid polymer acts as both a binder and a stabilizer for the solution. Upon imagewise irradiation the diazonium salt photodecomposes with bleaching. In the unexposed areas, if the top layer is passed over alkaline vapor, $NH_3$, ammonia being preferred, the unexposed diazonium salt and coupler react to form an essentially non-photobleachable dye. The whole system is then flood exposed with any u.v. radiation where the nonphotobleachable dye absorbs; the top layer acts as a portable conformable mask; and the bottom resist is developed out.

SUMMARY OF THE INVENTION

The invention provides a photoresist article which comprises a substrate; and a first light sensitive layer on said substrate, said first light sensitive layer comprising a photosensitive o-quinone diazide in sufficient amount to render said layer light sensitive and to provide image differentiation upon imagewise exposure and development of the layer, and at least one resin in admixture therewith which is aqueous alkaline soluble, water insoluble and is preferably selected from the group consisting of novolaks, polyvinyl phenols and copolymers containing vinyl phenols, in sufficient amount to bind said layer into a uniform film; and a second light sensitive layer on said first light sensitive layer, said second light sensitive layer comprising a water soluble, photobleachable diazonium salt and a coupler for said diazonium salt, said diazonium salt and coupler being present in sufficient amount to provide bleached image differentiation upon imagewise exposure to actinic radiation, and to form a u.v. absorbing azo dye in the imagewise non-exposed areas upon contact with sufficient basic vapor, in particular ammonia vapor; and a water soluble, film forming, sulfonic acid containing polymeric resin in admixture therewith, in sufficient amount to bind said second light sensitive layer into a uniform film.

The invention also provides a method of producing an imaged photoresist article which comprises coating a substrate with a first light sensitive layer comprising a photosensitive o-quinone diazide in sufficient amount to render said layer light sensitive and to provide image differentiation upon imagewise exposure and development of the layer, and at least one resin in admixture therewith selected from the group consisting of novolaks, polyvinyl phenols and copolymers containing polyvinyl phenols in sufficient amount to bind said layer into a uniform film; and coating a second light sensitive layer on said first light sensitive layer, said second light sensitive layer comprising a water soluble, photobleachable diazonium salt and a coupler for said diazonium salt, said diazonium salt and coupler being present in sufficient amount to provide bleached image differentiation upon imagewise exposure to actinic radiation, and to form a u.v. absorbing azo dye in the imagewise non-exposed areas upon contact with sufficient ammonia vapor; and a water soluble, film forming, sulfonic acid containing polymeric resin in admixture therewith, in sufficient amount to bind said second light sensitive layer into a uniform film; and imagewise exposing said article to sufficient actinic radiation to bleach portions of said second light sensitive layer thereby rendering such bleached portions transmissive to said actinic radiation; and contacting said article with sufficient ammonia vapor to form a u.v. absorbing azo dye in the imagewise non-exposed portions; then overall exposing said first light sensitive layer through the thusly treated second light sensitive layer to sufficient actinic radiation in a wavelength range where the azo dye absorbs and blocks said radiation out to imagewise expose said first light sensitive layer; and thereafter removing said entire second light sensitive layer; and developing said first light sensitive layer with an aqueous alkaline solution.

DETAILED DESCRIPTION OF THE PREFERRED EMBODIMENT

As hereinbefore mentioned the photoresist article comprises a substrate and first and second photosensitive layers thereon. The substrate may be any surface suitable for receiving the first photosensitive layer thereon. However, in the preferred embodiment the substrate comprises one or more components selected from the group consisting of silicon, aluminum, polymeric resins, silicon dioxide, doped silicon dioxide, silicon nitride, tantalum, copper, polysilicon, ceramics, aluminum/copper mixtures, gallium arsenide and other such Group III/V compounds.

The substrate may have an adhesion promoted layer of a suitable composition such as one containing hexaalkyl disilazane. On the substrate is a first photosensitive layer which is a photoresist composition. In the preferred embodiment this composition comprises a well known o-quinone diazide photosensitizer in admixture with a novolak or polyvinyl phenol containing resin. This composition is blended with a suitable solvent, and coated on the substrate and dried until it is non-tacky.

The production of novolak resins, which may be used for preparing photosensitive compositions, is well known in the art. A procedure for their manufacture is described in *Chemistry and Application of Phenolic Resins,* Knop A. and Scheib, W.; Springer Verlag, New York, 1979 in Chapter 4 which is incorporated herein by reference. Similarly, the use of o-quinone diazides is well known to the skilled artisan as demonstrated by *Light Sensitive Systems,* Kosar, J.; John Wiley & Sons, New York, 1965 in Chapter 7.4 which is also incorporated herein by reference. These sensitizers which comprise a component of the present U.V. resist compositions of the present invention are selected from the group of substituted naphthoquinone diazide sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; and 3,802,885. Useful photosensitizers include naphthoquinone-(1,2)-diazide-5-sulfonyl chloride, and naphthoquinone-(1,2)-diazide-4-sulfonyl chloride condensed with phenolic compounds such as hydroxy benzophenones, especially trihydroxy benzophenone.

In the preferred embodiment, the solid parts of the photoresist composition, that is the resin and diazide preferably ranges from 15% to about 99% novolak resin and from about 1% to about 85% quinone diazide. A more preferred range of resin would be from about 50% to about 90% and most preferably from about 65% to about 90% by weight of the solid resist parts. A more preferred range of the diazide would be from about 10% to about 50% and more preferably from about 10% to about 35% by weight of the solid resist parts.

The choice of solvent depends on the intended coating process, the desired coating thicknesses and the drying conditions. Suitable solvents for the composition of the invention include ethers (e.g. tetrahydrofuran), alcohols (e.g. n-propanol), alcohol-ethers (e.g. ethylene glycol monoethyl ether), esters (e.g. butyl acetate), aromatic or aliphatic hydrocarbons (e.g. xylene) or mixtures of solvents may also be used. In principal, all solvents which do not react irreversibly with the components of the coating can be used. Partial ethers of glycols, especially ethylene or propylene glycol monoethyl ether, or their esters are particularly preferred. A preferred solvent composition comprises propylene glycol mono-methyl ether and its acetate. Solvents may also include xylene, butylacetate and Cellosolve acetate.

Additives such as colorants, dyes, anti-striation agents, plasticizers, adhesion promoters, speed enhancers, solvents and such surfactants as non-ionic surfactants may be added to the solution of resin, sensitizer and acetate before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used up to five percent weight level, based on the combined weight of novolak and sensitizer.

Plasticizers which may be used include, for example, phosphoric acid tri-(beta-chloroethyl)-ester; stearic acid; dicamphor; polypropylene; acetal resins; phenoxy resins; and alkyl resins at one to ten percent weight levels, based on the combined weight of novolak and sensitizer. The plasticizer additives improved the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyldisilane-methyl methacrylate; vinyltrichlorosilane; and gamma-amino-propyl triethoxysilane up to a 4 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

Non-ionic surfactants that may be used include, for example, nonylphenoxy poly(ethyleneoxy) ethanol; octylphenoxy (ethyleneoxy) ethanol; and dinonyl phenoxy poly(ethyleneoxy) ethanol at up to 10 percent weight levels, based on the combined weight of novolak and sensitizer.

The prepared resist solution, can be applied to a substrate by any conventional method used in the photoresist art, including dipping, spraying in order to provide coating of the desired thickness given the type of spinning equipment utilized and the amount of time allowed for the spinning process. After the resist composition solution is coated onto the substrate, the substrate is preferably baked at approximately 80° to 105° C. until substantially all the solvent has evaporated and only a thin coating of a non-tacky photoresist composition on the order of a micron in thickness remains on the substrate.

On this photoresist layer one thereafter applies the second light sensitive layer which contains a water soluble, photobleachable diazonium salt; a coupler for the diazonium salt and a polymeric binder that is an acid so that it gives enhanced solubility and stability of the diazonium salt both in solution and as a film and prevents undesired coupling reactions. The system is blended together in water. Additional acid may be added if desired to prevent premature coupling reactions.

Suitable water soluble diazonium salts include virtually any of those known in the art. Examples of such diazonium salts, include those described in J. Kosar "Light Sensitive Systems" (1965, J. Wiley Sons Inc., New York), page 194; and M. S. Dinaburg "Photosensitive Diazo Compounds and Their Uses" (1964, The Focal Press).

One preferred diazonium salt is p-phenylene diamine diazonium chloride. The diazonium salt is present in its light sensitive layer in a amount of from about 10% to about 50% or preferably from about 20% to about 40% based on the weight of the solid components of the layer. The amount of polymer in the layer usually ranges from about 50% to about 90%, preferably about 60% to about 80% based on the weight of the solid components in the layer.

Examples of acidic polymer substituents non-exclusively include —SO$_3$H and OSO$_3$H. The polymers would be polystryene sulfonic acid, polyethylene sulfonic acid, polyvinylsulfonic acid and polyvinyl phenylsulfonic acid. Polystyrene sulfonic acid is the preferred polymer. Copolymers of either vinyl sulfonic acid or styrene sulfonic acid can also be prepared and used.

The acidic polymer in the second light sensitive layer is preferably present in a amount of from about 50% to about 90%; or preferably from about 60% to about 80%; or more preferably from about 65% to about 75% based on the weight of the solid components of the second light sensitive layer.

Coupling compounds which are included in the second light sensitive layer non-exclusively include compounds of the formula

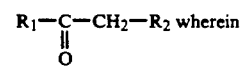 wherein

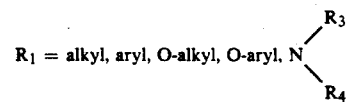

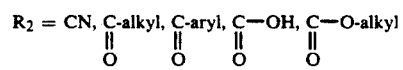

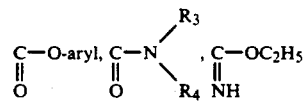

R$_3$, R$_4$=H, alkyl, aryl,

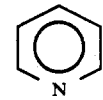

alkyl-COOH, aryl-COOH, alkyl-SO$_3$H, aryl-SO$_3$H

One preferred coupling compound is acetoacet paracresidine sulfonic acid. The coupler is preferably present in a amount of from about 1% to about 40%; or preferably from about 5% to about 25%; or more preferably from about 10% to about 20% based on the weight of the solid components of the second light sensitive layer.

Additives such as surfactants, defoaming agents and other materials can be added to improve the coating characteristics of the Built-on-Mask film.

In practice, a thin film of the second light sensitive layer, approximately 1.0 um, is spun on top of the photoresist to effectively work as a built-on mask. This upper light sensitive layer is either air dried or baked at an elevated temperature to remove water without degrading the solid constituents of the layer. This bilevel system is then imagewise exposed to allow the upper light sensitive diazonium salt containing layer to photobleach. The upper layer is then contacted with an alkaline vapor, preferably ammonia vapor which neutralizes the acid, also causing the diazonium salt and the coupler to couple in the basic medium to form an azo dye. The deeply colored dye formed aids in the visual inspection of the image prior to any development. This imagewise differentiation serves as a built-on mask for the next step which is an overall exposure of the lower photoresist through the mask image. The mask layer is then removed by a water rinse or in the subsequent development step. The bottom photoresist is developed with an appropriate developer, such as any known aqueous alkaline developer.

One suitable developer is AZ Developer available from the AZ Photoresist Products Group Of Hoechst Celanese Corporation, Somerville, N.J.

In effect, the mask bleaches during the exposure step and becomes transparent at the exposed portions. The azo dye which is formed must absorb light in the wavelength of the subsequent overall exposure. This absorption is preferably in the u.v. portion of the spectrum, more preferably in the 313–450 nm range, and in one preferred embodiment has an absorption peak at about 436 nm. The overall flood exposure of actinic radiation passes through the transparent portions and exposes the photoresist below while the azo dye blocks such irradiation in the non-image areas. Since the unexposed portions of azo dye block light radiation transmission, an imagewise differentiation is achieved. Preferably the dyed portion has a transmission of less than 10% in the unexposed areas for the wavelengths of light used for the exposure, more preferably less than 1%. Although in general, the use of o-quinone diazide photosensitizers provide positive working systems, the present invention is not intended to be so limited. The invention also encompasses the so-called image reversal processes wherein, by appropriate additions to the photoresist composition and/or additional processing steps, the o-quinone diazide layer can also produce negative images. Such may be produced by including a cross-linking compound such as a dimethylol paracresol in the photoresist layer.

The following specific examples will provide detailed illustrations of the methods of producing and utilizing the compositions of the present invention. These examples are not intended, however, to limit or restrict the scope of the invention in any way and should not be construed as providing conditions, parameters or values which must be utilized exclusively in order to practice the present invention.

EXAMPLES

Comparative Example 1

|  | w/w % |
|---|---|
| Cresol Novolak Resin | 24.4 g |
| Photosensitizer comprising the condensation product of 2,3,4-trihydroxybenzophenone and 1,2 naphthoquinone 2-diazide-5-sulfonyl chloride | 7.5 g |
| AZ Thinner | 68.1 g |

The above resist is spin coated on a silicon wafer at 4000 rpm and baked at 90° C. for 30 minutes in a convection oven to give a film coating of 1.9 um. The contrast of this resist is determined by exposing the film through a glass mask of graduated and known optical density. The exposure is done using 436 nm filtered light from a broad band illumination source. The resist is developed in a 0.23N AZ 351 developer for 60 seconds. The film thickness remaining after development and with known amounts of exposure dose is measured. The slope of the plot of film thickness remaining against log exposure dose is the contrast of the resist. Under these conditions a contrast of 6.7 is obtained with a photospeed of 93 mJ/cm$^2$.

Example 2

Built-on-Mask

|  | w/w % |
|---|---|
| Polystyrene sulfonic acid (15% water solution) | 5.4 g |
| Water | 3.2 g |
| 2,5-Diethoxy-4-morpholino benzene diazonium chloride ½ zinc chloride salt | 1.1 g |
| Ammonium Acetoacetparacresidine sulfonate | 0.88 g |

The resist from Comparative Example 1 is spun on a silicon wafer at 4000 rpm, baked at 90° C. for 30 minutes in a convection oven to give a film thickness of 1.9 um. On top of this is spun the Built-on-Mask (BOM) solution at 2000 rpm and baked at 90° C. for 30 minutes in a convection oven. The film thickness of the BOM is 1.0 um. The bilevel is exposed through a glass mask of graduated and known optical density. The exposure tool is a Perkin Elmer Micralign 220, which has broad band illumination. The wafer is held above a solution of ammonium hydroxide for 60 seconds. The unexposed areas are seen to redden, thus making these areas very visible. The bilevel is then given a flood exposure of 100 mJ/cm$^2$ using 436 um filtered light (photospeed of Comparative Example 1). The BOM is rinsed off in deionized water. The bottom resist is developed in 0.23N AZ 351 developer for 60 seconds. The film thickness remaining after development and with known amounts of exposure dose is measured. The slope of the plot of film thickness remaining against log exposure dose is the contrast of the resist. Under these conditions a contrast of 12.1 is obtained with a photospeed of 129 mJ/cm$^2$.

What is claimed is:

1. A method of producing a positive imaged photoresist article which comprises coating a substrate with a first light sensitive layer comprising a photosensitive o-quinone diazide in sufficient amount to render said layer light sensitive and to provide image differentiation upon imagewise exposure and development of the layer, and at least one water insoluble, aqueous alkaline soluble resin in admixture therewith in sufficient amount to bind said layer into a uniform film; and coating a second light sensitive layer on said first light sensitive layer, said second light sensitive layer comprising a water soluble, photobleachable diazonium salt and a coupled for said diazonium salt, said diazonium salt and coupler being present in sufficient amount to provide bleached image differentiation upon imagewise exposure to actinic radiation, and to form a u.v. absorbing azo dye in the imagewise nonexposed area upon contact with sufficient alkaline vapor; and a water soluble, film forming, sulfonic acid containing polymeric resin in admixture therewith, in sufficient amount to bind said second light sensitive layer into a uniform film; and imagewise exposing said article to sufficient actinic radiation to bleach portions of said second light sensitive layer at the exposed locations thereby rendering such bleached portions transmissive to said actinic radiation; and contacting said article with sufficient alkaline vapor to form a u.v. absorbing azo dye in the imagewise nonexposed portions; then overall exposing said first light sensitive layer through the thusly treated second light sensitive layer to sufficient actinic radiation in a wavelength range where the axo dye absorbs and blocks said radiation out to imagewise expose said first light sensitive layer to provide image and non-image areas; and thereafter removing said entire second light sensitive layer; and developing said first light sensitive layer with an aqueous alkaline solution to thereby remove the exposed non-image areas of the first light sensitive layer.

2. The method of claim 1 wherein said resin in the first light sensitive layer is selected from the group consisting of novolaks, polyvinyl phenols and vinyl phenol containing copolymers.

3. The method of claim 1 wherein said diazide is a naphthoquinone-(1,2-)diazide-4 or 5-sulfonyl chloride condensed with a hydroxybenzophenone.

4. The method of claim 1 wherein said resin in the second light sensitive layer is selected from the group consisting of vinyl sulfonic acid, and polystyrene sulfonic acid.

5. The method of claim 1 wherein said diazonium salt is 2,5 diethoxy-4-morpholino benzene diazonium chloride ½ zinc chloride salt.

6. The method of claim 1 wherein said coupler is acetoacet paracresidine sulfonic acid or salt thereof.

7. The method of claim 1 wherein said azo dye absorbs in the 313 to 436 nm range.

8. The method of claim 1 wherein said azo dye has an absorption peak at about 436 nm.

9. The method of claim 1 wherein said resin is a cresol formaldehyde novolak resin.

10. The method of claim 1 wherein the coupler has the formula:

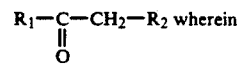

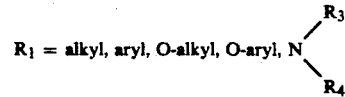

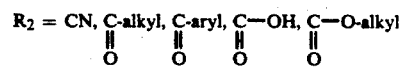

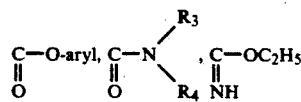

$R_3$, $R_4$=H, alkyl, aryl, N, alkyl-COOH, aryl-COOH, alkyl-SO3H, aryl-SO3H.

11. The method of claim 1 wherein the coupler is ammonium acetoacetparacresidine sulfonate.

* * * * *